US012572493B2

(12) United States Patent
Jin et al.

(10) Patent No.: US 12,572,493 B2
(45) Date of Patent: Mar. 10, 2026

(54) ELECTRONIC DEVICE HAVING A PLURALITY OF CHIPLETS

(71) Applicant: REBELLIONS INC., Seongnam-si (KR)

(72) Inventors: Young-Jae Jin, Seongnam-si (KR); Miock Chi, Seongnam-si (KR)

(73) Assignee: REBELLIONS INC., Seongnam-si (KR)

( * ) Notice: Subject to any disclaimer, the term of this patent is extended or adjusted under 35 U.S.C. 154(b) by 0 days.

(21) Appl. No.: 18/934,712

(22) Filed: Nov. 1, 2024

(65) Prior Publication Data

US 2025/0181477 A1     Jun. 5, 2025

(30) Foreign Application Priority Data

Dec. 4, 2023     (KR) ......................... 10-2023-0173828
Feb. 15, 2024     (KR) ......................... 10-2024-0022154

(51) Int. Cl.
| | |
|---|---|
| *G06F 11/00* | (2006.01) |
| *G06F 11/30* | (2006.01) |
| *G06F 11/34* | (2006.01) |
| *G06F 13/14* | (2006.01) |
| *G06F 13/16* | (2006.01) |
| *G06F 13/28* | (2006.01) |
| *G06F 13/36* | (2006.01) |
| *G06F 13/40* | (2006.01) |
| *H01L 23/538* | (2006.01) |
| *H01L 25/065* | (2023.01) |

(52) U.S. Cl.
CPC ...... *G06F 13/4068* (2013.01); *G06F 11/3006* (2013.01); *G06F 11/3051* (2013.01); *G06F 11/348* (2013.01); *G06F 13/14* (2013.01); *G06F 13/1673* (2013.01); *G06F 13/28* (2013.01); *G06F 13/36* (2013.01); *G06F 13/4031* (2013.01); *G06F 13/409* (2013.01); *H01L 23/5382* (2013.01); *H01L 23/5385* (2013.01); *H01L 25/0655* (2013.01); *G06F 2213/0026* (2013.01); *G06F 2213/40* (2013.01)

(58) Field of Classification Search
CPC .................................................... G06F 11/348
See application file for complete search history.

(56) References Cited

U.S. PATENT DOCUMENTS

| | | | | |
|---|---|---|---|---|
| 9,236,864 | B1 * | 1/2016 | Loh ...................... | G11C 29/702 |
| 2019/0235465 | A1 * | 8/2019 | Lee ......................... | G05B 19/05 |
| 2020/0027521 | A1 * | 1/2020 | Choi ...................... | H10B 69/00 |

* cited by examiner

*Primary Examiner* — Katherine Lin
(74) *Attorney, Agent, or Firm* — BROADVIEW IP LAW, PC

(57) ABSTRACT

Provided is an electronic device, including a first chiplet including a system bus, a first interconnect module, and a second interconnect module, and a second chiplet connected to the first chiplet through at least one of a first interconnect interface connected to the first interconnect module or second interconnect interface connected to the second interconnect module, in which, in response to determining that a communication failure occurs between the first chiplet and the second chiplet, at least a part of a transfer path through which information is transmitted from the first chiplet to the second chiplet is changed.

17 Claims, 10 Drawing Sheets

FIRST DATA PATH 512

SECOND DATA PATH 514

THIRD DATA PATH 516

FOURTH DATA PATH 518

M0     S0

M1     S1

SWITCH LOGIC
500

M2     S2

M3     S3

FIRST DATA PATH 612

SECOND DATA PATH 614

THIRD DATA PATH 616

FOURTH DATA PATH 618

M0

M1

M2

M3

SWITCH LOGIC
600

S0

S1

S2

S3

FIFTH DATA PATH 622

SIXTH DATA PATH 624

SEVENTH DATA PATH 626

EIGHTH DATA PATH 628

630

FIRST DATA PATH 712          M0 ........... S0          FIFTH DATA PATH 722

SECOND DATA PATH 714          M1          S1          SIXTH DATA PATH 724

SWITCH LOGIC
700

THIRD DATA PATH 716          M2          S2          SEVENTH DATA PATH 726

FOURTH DATA PATH 718          M3          S3          EIGHTH DATA PATH 728

| | S0 | S1 | S2 | S3 |
|---|---|---|---|---|
| CASE#1 | – | – | – | – |
| CASE#2 | M0, M2 | M1, M3 | – | – |
| CASE#3 | – | – | M0, M2 | M1, M3 |
| CASE#4 | M0 | M1, M3 | M2 | – |
| CASE#5 | M0, M2 | M1 | – | M3 |
| CASE#6 | M0 | – | M2 | M1, M3 |
| CASE#7 | – | M1 | M0, M2 | M3 |

ELECTRONIC DEVICE HAVING A PLURALITY OF CHIPLETS

CROSS-REFERENCE TO RELATED APPLICATIONS

This application claims priority to Korean Patent Application No. 10-2023-0173828, filed in the Korean Intellectual Property Office on Dec. 4, 2023, and Korean Patent Application No. 10-2024-0022154, filed in the Korean Intellectual Property Office on Feb. 15, 2024, the entire contents of which are hereby incorporated by reference.

BACKGROUND

Field

The present disclosure relates to an electronic device including a plurality of chiplets.

Description of Related Art

The demand for high performance and miniaturization of semiconductor devices and electronic products using the same has increased, leading to the development of various package technologies related to semiconductor devices. Along with the development of these technologies, packaging technologies using chiplets have recently emerged.

Chiplet system may refer to a system that is provided by, rather than configuring chips performing various functions on one die (or substrate), dividing the chips in units of functionalities, configuring the divided chips on each of a plurality of dies (chiplet), and packaging them into one system. That is, the chiplet system was developed to overcome the limitations of existing monolithic chips, and the chiplets can be miniaturized by dividing them into functional units. Accordingly, the size limitation of reticles, which serve as the templates to print circuits on wafer surfaces using light in the photolithography process of semiconductors, can be overcome. In addition, since the yield of semiconductor manufacturing tends to be inversely proportional to the area, use of the chiplet can enhance the yield of semiconductor manufacturing and reduce manufacturing costs. Accordingly, in recent years, there is an increasing demand for using the chiplet when manufacturing electronic products.

The dies in the chiplet system may be connected to each other through a silicon interposer and communicate with each other according to a die-to-die communication standard such as Universal Chiplet Interconnect Express (UCIe).

When transmitting and receiving information such as transactions between dies in the chiplet system, communication failures such as disconnection, communication performance degradation, etc. may occur. Therefore, there is a need for a technology that can respond to such a communication failure by smoothly transmitting and receiving information between dies.

SUMMARY

In order to solve one or more problems (e.g., the problems described above and/or other problems not explicitly described herein), the present disclosure provides an electronic device including a plurality of chiplets.

The present disclosure may be implemented in a variety of ways, including methods, devices (systems) and/or computer programs stored in computer readable storage media.

According to some aspects of the present disclosure, an electronic device may include a first chiplet including a system bus, a first interconnect module, and a second interconnect module, and a second chiplet connected to the first chiplet through at least one of a first interconnect interface connected to the first interconnect module or second interconnect interface connected to the second interconnect module, in which, in response to determining that a communication failure occurs between the first chiplet and the second chiplet, at least a part of a transfer path through which information is transmitted from the first chiplet to the second chiplet may be changed.

The transfer path may include a path through which the information is transmitted to the first interconnect interface and a path through which the information is transmitted to the second interconnect interface.

In response to a disconnection of at least a part of the path through which the information is transmitted to the first interconnect interface or at least a part of the path through which the information is transmitted to the second interconnect interface, or in response to an occurrence of a communication performance degradation equal to or greater than a predetermined threshold, it may be determined that the communication failure occurs between the first chiplet and the second chiplet.

The system bus may include a switch logic, and the switch logic may be activated in response to the occurrence of the communication failure to change at least a part of the transfer path.

The system bus may include a data bus used for data transmission and reception.

The information may include a transaction, and the switch logic may be connected to the data bus to change at least a part of a transfer path through which the transaction is transmitted.

The transfer path may include a first path through which information is transmitted to the switch logic, a second path through which the information is transmitted from the switch logic to the first interconnect interface, and a third path through which the information is transmitted from the switch logic to the second interconnect interface.

The switch logic may include a first logic that is activated in response to determining that a disconnection occurs in at least a part of the second path or at least a part of the third path, and the first logic may include a logic that connects the first path to the third path in response to determining that a disconnection occurs in at least a part of the second path, and connects the first path to the second path in response to determining that a disconnection occurs in at least a part of the third path.

The switch logic may further include a second logic that is activated in response to determining that a communication performance degradation equal to or greater than a predetermined threshold occurs in at least a part of the second path or at least a part of the third path.

The first path may include a plurality of sub-paths, the second logic may connect each of the plurality of sub-paths to the second path or the third path in response to determining that the communication performance degradation equal to or greater than the predetermined threshold occurs in at least the part of the second path, and among the plurality of sub-paths, a number of sub-paths connected to the third path is greater than a number of sub-paths connected to the second path.

The system bus may include a distributor, the transfer path may include a fourth path through which information is transmitted to the distributor, a fifth path through which the information is transmitted from the distributor to the first interconnect interface, and a sixth path through which the information is transmitted from the distributor to the second interconnect interface, and the distributor may connect the fifth path or the sixth path to the fourth path in response to determining that no communication failure has occurred.

The distributor may connect the fourth path to the sixth path in response to determining that a communication failure occurs in the fifth path, and may connect the fourth path to the fifth path in response to determining that a communication failure occurs in the sixth path.

The information transmitted to the second chiplet through the distributor may be a control transaction.

The system bus may include a control bus that transmits a control signal, and the control signal may be transmitted to at least one of the first interconnect module or the second interconnect module.

The information transmitted to the second chiplet using the first interconnect interface may be transmitted based on a first clock, the information transmitted to the second chiplet using the second interconnect interface may be transmitted based on a second clock, and the first clock and the second clock may be different from each other.

The system bus may operate based on a third clock different from the first clock and the second clock, and the information transmitted to the second chiplet using the first interconnect interface or the second interconnect interface may be transmitted to the first interconnect interface or the second interconnect interface through an asynchronous First-In, First-Out (FIFO).

The first clock may be generated by the first interconnect module, and the second clock may be generated by the second interconnect module.

The first interconnect module and the second interconnect module may be configured to communicate with each other based on a first protocol, and at least one of the first chiplet or the second chiplet may include a third interconnect module configured to communicate with a host based on the second protocol.

The first interconnect module and the second interconnect module may be modules that support at least one of Universal Chiplet Interconnect Express (UCIe), High-Bandwidth Interconnect (HBI), Bunch of Wires (BoW), or extra-short reach (XSR), and the third interconnect module may be a module that supports Peripheral Component Interconnect Express (PCIe).

The system bus may be an Advanced extensible Interface (AXI) type bus.

According to some aspects of the present disclosure, the host manages the chiplet system, distributes tasks related to at least some functions to the chiplet system, and the chiplet system processes the distributed tasks in parallel, thereby optimizing the performance of the entire system and providing a scalable computing environment.

According to some aspects of the present disclosure, by using the switch logic, transmission and reception of data between chiplets is not stopped despite communication failure due to disconnection or communication performance degradation, etc., thereby improving reliability of the electronic device.

The effects of the present disclosure are not limited to the effects described above, and other effects not described herein can be clearly understood by those of ordinary skill in the art (referred to as "ordinary technician") from the description of the claims.

BRIEF DESCRIPTION OF THE DRAWINGS

Aspects of the present disclosure will be described with reference to the accompanying drawings described below, where similar reference numerals indicate similar elements, but is not limited thereto, in which:

FIG. 8 is a diagram illustrating an example implementation of a switch logic;

DETAILED DESCRIPTION

Figure 1:
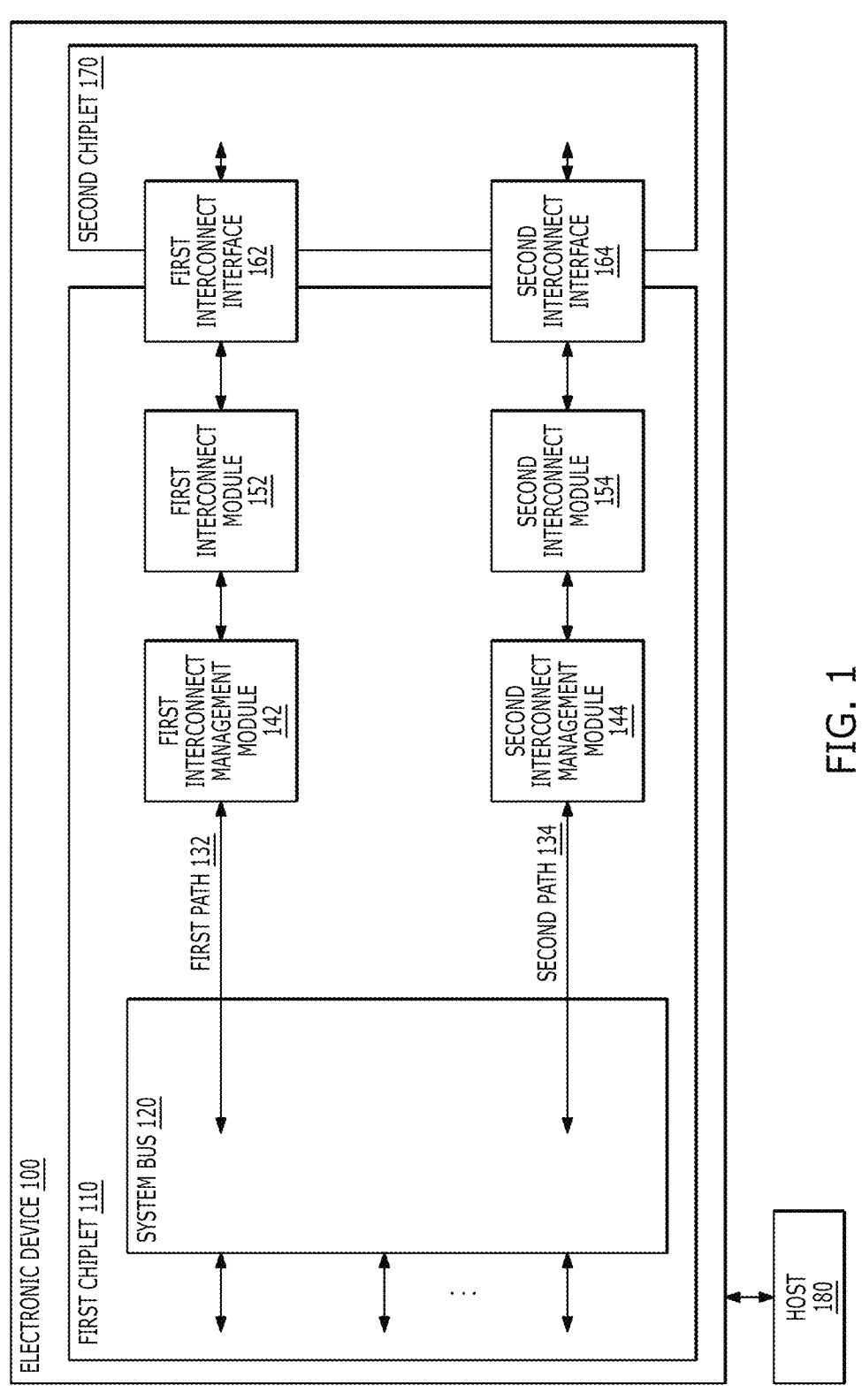
FIG. 1 is a diagram provided to explain a configuration of an electronic device including a plurality of chiplets.

Specific details for implementing the present disclosure will be described in detail with reference to the accompanying drawings. However, in the following description, detailed description of well-known functions or configurations will be omitted when it may make the subject matter of the present disclosure rather unclear.

In the accompanying drawings, the same or corresponding components are given the same reference numerals. In addition, in the following description of various examples, duplicate descriptions of the same or corresponding components may be omitted. However, even if descriptions of components are omitted, it is not intended that such components are not included in any example.

Advantages and features of the disclosed examples and methods of accomplishing the same will be apparent by referring to examples described below in connection with the accompanying drawings. However, the present disclosure is not limited to the examples disclosed below, and may be implemented in various forms different from each other, and the examples are merely provided to make the present disclosure complete, and to fully disclose the scope of the disclosure to those skilled in the art to which the present disclosure pertains.

The terms used herein will be briefly described prior to describing the disclosed example(s) in detail. The terms used herein have been selected as commonly used terms which are widely used at present in consideration of the functions of the present disclosure, and this may be altered according to the intent of an operator skilled in the art, related practice, or introduction of new technology. In addition, in specific cases, certain terms may be arbitrarily selected by the applicant, and the meaning of the terms will be described in detail in a corresponding description of the example(s). Therefore, the terms used in the present disclosure should be defined based on the meaning of the terms and the overall content of the present disclosure rather than a simple name of each of the terms.

The singular forms "a," "an," and "the" as used herein are intended to include the plural forms as well, unless the context clearly indicates the singular forms. Further, the plural forms are intended to include the singular forms as well, unless the context clearly indicates the plural forms. Further, throughout the description, when a portion is stated as "comprising (including)" a component, it is intended as meaning that the portion may additionally comprise (or include or have) another component, rather than excluding the same, unless specified to the contrary.

Further, the term "module" or "unit" used herein refers to a software or hardware component, and "module" or "unit" performs certain roles. However, the meaning of the "module" or "unit" is not limited to software or hardware. The "module" or "unit" may be configured to be in an addressable storage medium or configured to play one or more processors. Accordingly, as an example, the "module" or "unit" may include components such as software components, object-oriented software components, class components, and task components, and at least one of processes, functions, attributes, procedures, subroutines, program code segments, drivers, firmware, micro-codes, circuits, data, database, data structures, tables, arrays, or variables. Furthermore, functions provided in the components and the "modules" or "units" may be combined into a smaller number of components and "modules" or "units", or further divided into additional components and "modules" or "units."

The "module" or "unit" may be implemented as a processor and a memory. The "processor" should be interpreted broadly to encompass a general-purpose processor, a Central Processing Unit (CPU), a microprocessor, a Digital Signal Processor (DSP), a controller, a microcontroller, a state machine, and so forth. Under some circumstances, the "processor" may refer to an application-specific integrated circuit (ASIC), a programmable logic device (PLD), a field-programmable gate array (FPGA), etc. The "processor" may refer to a combination for processing devices, e.g., a combination of a DSP and a microprocessor, a combination of a plurality of microprocessors, a combination of one or more microprocessors in conjunction with a DSP core, or any other combination of such configurations. In addition, the "memory" should be interpreted broadly to encompass any electronic component that is capable of storing electronic information. The "memory" may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EE-PROM), flash memory, magnetic or marking data storage, registers, etc. The memory is said to be in electronic communication with a processor if the processor can read information from and/or write information to the memory. The memory integrated with the processor is in electronic communication with the processor.

In addition, terms such as first, second, A, B, (a), (b), etc. used in the following examples are only used to distinguish certain components from other components, and the nature, sequence, order, etc. of the corresponding components are not limited by the terms.

In addition, in the following examples, if a certain component is stated as being "connected," "combined" or "coupled" to another component, it is to be understood that there may be yet another intervening component "connected," "combined" or "coupled" between the two components, although the two components may also be directly connected or coupled to each other.

In addition, as used in the following examples, "comprise" and/or "comprising" does not foreclose the presence or addition of one or more other elements, steps, operations, and/or devices in addition to the recited elements, steps, operations, or devices.

In addition, in the following examples, "each of a plurality of A's" may refer to each of all components included in the plurality of A's, or may refer to each of some of the components included in the plurality of A's.

In the present disclosure, a "chiplet" is an integrated circuit (IC) block, which may be combined/connected/coupled with another chiplet to configure one package.

In the present disclosure, a "path" may refer to a physical and/or logical channel through which information such as data and/or control signals is transmitted. For example, a "path" from one chiplet to another may include a bus, a module, an interface, etc. for the transfer of information to another chiplet.

In the present disclosure, a "control transaction" may refer to a transaction including commands, instructions, synchronization signals, state information, feedback information, etc. for managing or coordinating the operation of the chiplet, communication between chiplets, etc., so as to perform a role of causing the chiplet to start a certain task, configure a specific parameter, provide a state update, etc.

In the present disclosure, a "data transaction" is a transaction associated with actual data transfer between chiplets, and may refer to a transaction for exchanging information necessary for the chiplet to perform the task. For example, the data transaction may include a payload having an operation result value, etc.

Hereinafter, various aspects of the present disclosure will be described in detail with reference to the accompanying drawings.

FIG. 1 is a diagram provided to explain a configuration of an electronic device 100 including a plurality of chiplets 110 and 170. The electronic device 100 may include the first chiplet 110 and the second chiplet 170, and may be connected to a host 180. Although only the first chiplet 110 and the second chiplet 170 are illustrated in FIG. 1 for convenience of description, aspects are not limited thereto, and the electronic device 100 may include any number of chiplets.

The first chiplet 110 may include a system bus 120, a first interconnect management module 142, a second interconnect management module 144, a first interconnect module 152, and a second interconnect module 154. In the illustration of the internal components of the first and second chiplets 110 and 160 in FIG. 1, components other than those necessary to explain transmission and reception of information between the first and second chiplets 110 and 160 may be omitted. For example, the first chiplet 110 may further include another interconnect management module and interconnect module connected to the system bus 120 so as to be further connected to another chiplet adjacent to the second chiplet 160, and may include a processing core, a Central Processing Unit (CPU), etc. connected to the system bus 120.

The first chiplet 110 and the second chiplet 170 may be connected through at least one of a first interconnect interface 162 and a second interconnect interface 164 to transmit and receive information to and from each other. The interconnect modules 152 and 154 may be configured to support at least one of Universal Chip Interconnect Express (UCIE), High-Bandwidth Interconnect (HBI), Bunch of Wires (BoW), or extra-short reach (XSR), and each of the interconnect modules 152 and 154 may include a controller and/or a physical (PHY) module.

The first chiplet 110 and the second chiplet 170 may transmit and receive information such as transaction, control signals, etc. to and from each other. The transaction may include a control transaction and/or a data transaction. The transaction may be a burst transaction transmitted by a burst transfer method.

The system bus 120 may transmit and receive information to and from the second chiplet 170 through a first path 132 and/or a second path 134. The first path 132 may represent a path for transmitting and receiving information to and from the second chiplet 170 using the first interconnect interface 162, and the second path 134 may represent a path for transmitting and receiving information to and from the second chiplet 170 using the second interconnect interface 164. For example, a part of the information to be transmitted to the second chiplet 170 may be transmitted through the first path 132, and the remaining part of the information may be transmitted through the second path 134.

In response to determining that a communication failure, etc. occurs between the first chiplet 110 and the second chiplet 170, at least a part of a transfer path through which information is transmitted from the first chiplet 110 to the second chiplet 170 may be changed. For example, in response to the occurrence of a communication failure in the first interconnect interface 162, etc., at least a part of the information to be transmitted to the first path 132 may be transmitted to the second chiplet 170 through the second path 134. This will be described below in detail with reference to FIGS. 3 to 10.

The interconnect management modules 142 and 144 may process or manage any information for managing communication between the first chiplet 110 and the second chiplet 170. As an example, the interconnect management modules 142 and 144 may track information transmitted between the first chiplet 110 and the second chiplet 170 to determine whether a time-out occurs. Additionally or alternatively, the interconnect management modules 142 and 144 may monitor the operation or performance of the first chiplet 110 and/or the second chiplet 170 or record traffic information.

The interconnect management modules 142 and 144 may determine whether a communication failure associated with the interconnect interfaces 162 and 164 occurs, and provide such information to the system bus 120. For example, the interconnect management modules 142 and 144 may determine whether a communication failure associated with the interconnect interfaces 162 and 164 occurs, based on the health check result conducted at predetermined time intervals and/or the presence or absence of a time-out determined by tracking the information transmitted between the first chiplet 110 and the second chiplet 170, etc., and provide this information to the system bus 120. The system bus 120 may determine and/or change the information transfer path between the chiplets based on the information received from the interconnect management modules 142 and 144.

At least one of the first chiplet 110 and the second chiplet 170 may further include an interconnect module configured to communicate with the host 180. At least one of the first chiplet 110 or the second chiplet 170 may communicate with the host 180 based on the Peripheral Component Interconnect Express (PCIe) standard, and the interconnect module configured to communicate with the host 180 may be a module supporting the PCIe.

Figure 2:
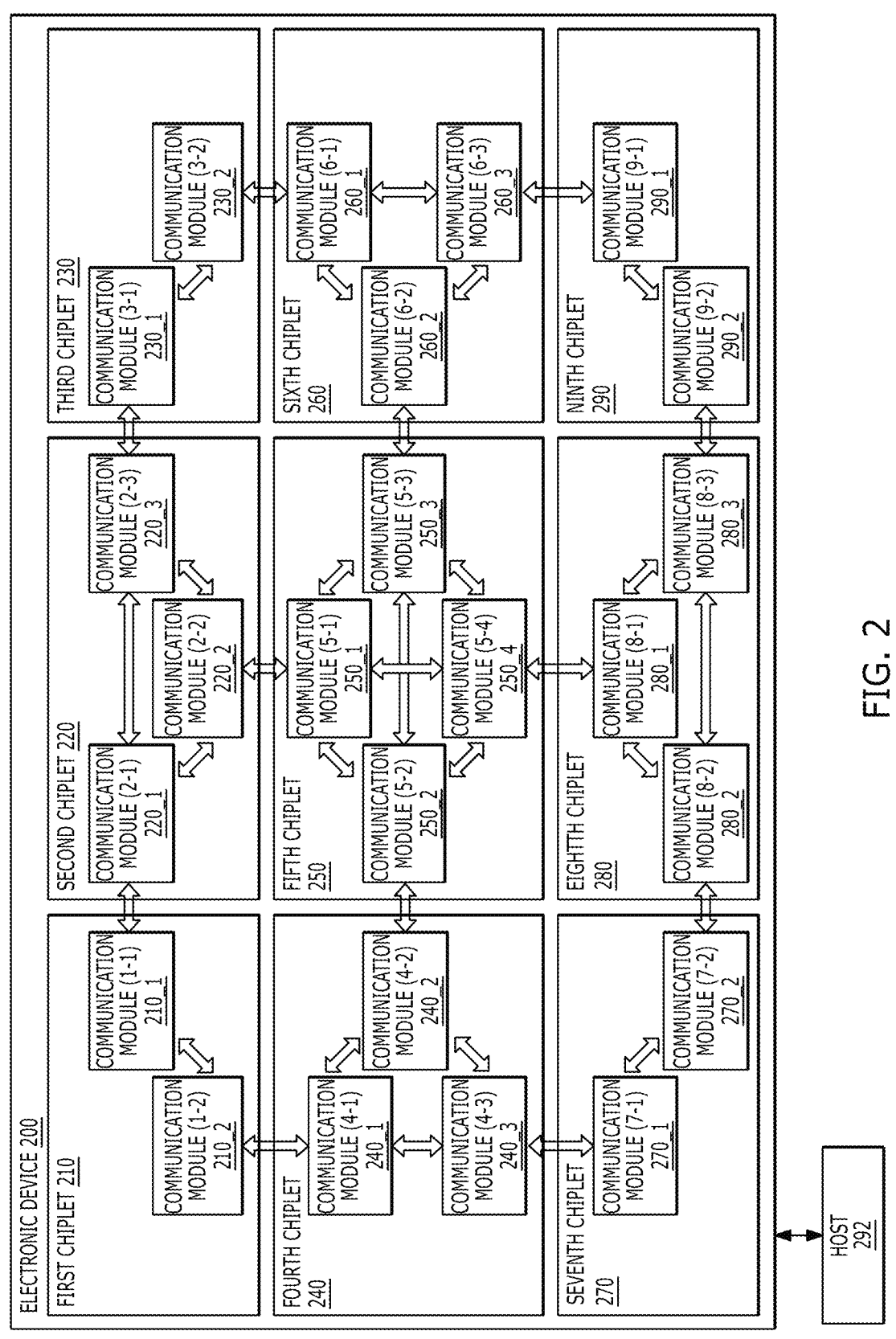
FIG. 2 is a diagram illustrating an example of an electronic device.

FIG. 2 is a diagram illustrating an example of an electronic device 200. Referring to FIG. 2, the electronic device 200 may include a plurality of chiplets. For example, the electronic device 200 may include a first chiplet 210, a second chiplet 220, a third chiplet 230, a fourth chiplet 240, a fifth chiplet 250, a sixth chiplet 260, a seventh chiplet 270, an eighth chiplet 280, and a ninth chiplet 290. However, the number of chiplets included in the electronic device 200 is not limited to the above. According to various aspects, the electronic device 200 may omit at least one of the chiplets described above, and may further include at least one additional chiplet. In addition, the arrangement of chiplets included in the electronic device 200 is not limited to those illustrated herein, and the chiplets may be arranged in various other ways according to the purpose. The electronic device 100 including a plurality of chiplets may be packaged, and thus may be referred to as a packaged device or chiplet system.

Each of the plurality of chiplets may include various components such as a processing core, a memory, an input/output (I/O) interface, a power management circuit, a control logic, an Analog-to-Digital Converter (ADC), a Digital-to-Analog Converter (DAC), a memory, etc.

Each of the plurality of chiplets may include one or more communication modules. Each of the plurality of chiplets may include one or more communication modules capable of communicating with each of the other chiplets adjacent to each of the plurality of chiplets. For example, the first chiplet 210 may include a communication module (1-1) 210_1 and a communication module (1-2) 210_2, and the second chiplet 220 may include a communication module (2-1) 220_1, a communication module (2-2) 220_2, and a communication module (2-3) 220_3. In addition, the fifth chiplet 250 may include a communication module (5-1) 250_1, a communication module (5-2) 250_2, a communication module (5-3) 250_3, and a communication module (5-4) 250_4. A chiplet including the same number of communication modules may be implemented in the same architecture. For example, the fourth chiplet 240 and the sixth chiplet 260 may be implemented in the same architecture, but may be combined with different chiplets in different directions. For example, a communication module (4-1) 240_1 and a communication module (6-1) 260_1, a communication module (4-2) 240_2 and a communication module (6-2) 260_2, and a communication module (4-3) 240_3 and a communication module (6-3) 260_3 may correspond to each other.

Alternatively, each of the plurality of chiplets may include the same number of communication modules. For example, like the fifth chiplet 250, each of the plurality of chiplets included in the electronic device 200 may include four communication modules, although communication modules in the directions where there is no adjacent chiplet are not shown in FIG. 2 for convenience of explanation.

The communication module may include a controller and a PHY layer. Additionally, the communication module may include the interconnect management modules 142 and 144 of FIG. 1.

Each of the plurality of chiplets may be connected to each other through the communication module and the interconnect interface (indicated by an arrow between communication modules of different chiplets in FIG. 2). For example, the fifth chiplet 250 and the eighth chiplet 280 may be connected to each other via the communication module (5-4) 250_4, a communication module (8-1) 280_1, and an interface. The chiplet interconnect interface may refer to a die-to-die interface, and may include, for example, Universal Chiplet Interconnect Express (UCIe), High-Bandwidth Interconnect (HBI), Bunch of Wires (BoW), extra-short reach (XSR), etc.

Each of the communication modules in the plurality of chiplets may be connected to each other through a bus interface (indicated by arrows between communication modules in one chiplet in FIG. 2). For example, a communication module (3-1) 230_1 and a communication module (3-2) 230_2 in the third chiplet 230 may be connected to each other through a bus interface. Likewise, a communication module (9-1) 290_1 and a communication module (9-2) 290_2 in the ninth chiplet 290 may be connected to each other through a bus interface. Additionally, aspects are not limited to the communication between communication modules, and components in each chiplet may communicate with other components through a bus interface, etc. The bus interface may be an Advanced extensible Interface (AXI) type interface. For example, each of the communication modules in the plurality of chiplets may be connected to each other through an AXI Master port and an AXI Slave port, and each of the AXI Master port and the AXI Slave port may include a read port and a write port.

Information may be transmitted and received within the electronic device 200 using the communication module, the interconnect interface, and/or the bus interface of each of the plurality of chiplets. For example, if information is transmitted from the fourth chiplet 240 to the ninth chiplet 290, the information may be transmitted to the ninth chiplet 290 in the order of the communication module (4-3) 240_3, a communication module (7-1) 270_1, a communication module (7-2) 270_2, a communication module (8-2) 280_2, a communication module (8-3) 280_3, and a communication module (9-2) 290_2. Alternatively, if information is transmitted from the fourth chiplet 240 to the ninth chiplet 290, the information may be transmitted to the ninth chiplet 290 in the order of the communication module (4-2) 240_2, the communication module (5-2) 250_2, the communication module (5-3) 250_3, the communication module (6-2) 260_2, the communication module (6-3) 260_3, and the communication module (9-1) 290_1. The path for routing the information from a specific chiplet to another chiplet may be determined by the architecture of the chiplet system or may be determined by various routing algorithms such as the Dijkstra algorithm, the Bellman-Ford algorithm, etc., although aspects are not limited thereto.

Any one (e.g., the first chiplet 210) of the plurality of chiplets may be connected to an external device (e.g., a host 292) through a host interface. In this case, the other chiplets (e.g., the second chiplet 220, etc.) may be restricted from the communication with external devices. The chiplet (e.g., the first chiplet 210) communicating with the external device may be referred to as a main chiplet, a primary die, a base chiplet, etc., and the other chiplets (e.g., the second chiplet 220, etc.) with restricted communication with the external device may be referred to as sub-chiplets, secondary dies, partner chiplets, etc. The host interface connecting the host 292 to the electronic device 200 or the main chiplet may include a Peripheral Component Interconnect Express (PCIe), etc.

The electronic device 200 may include a plurality of chiplets, that is, the chiplet system may extend the functions of the host 292 (or the host system) and perform parallel processing for at least some functions. For example, the host 292 may manage the chiplet system and distribute tasks related to at least some functions to the chiplet system, and the chiplet system may process the distributed tasks in parallel. This not only enables the optimization and enhancement of the performance of the entire system including the host 292 and the chiplet system, but also provides a scalable computing environment. The chiplet system may perform functions of a multi-processor, a memory controller, a cache, a network interface, etc.

The electronic device 200 and the host 292 may correspond to the electronic device 100 and the host 180 of FIG. 1, respectively, and the first chiplet 210 and the second chiplet 220 may correspond to the first chiplet 110 and the second chiplet 170 of FIG. 1.

Figure 3:
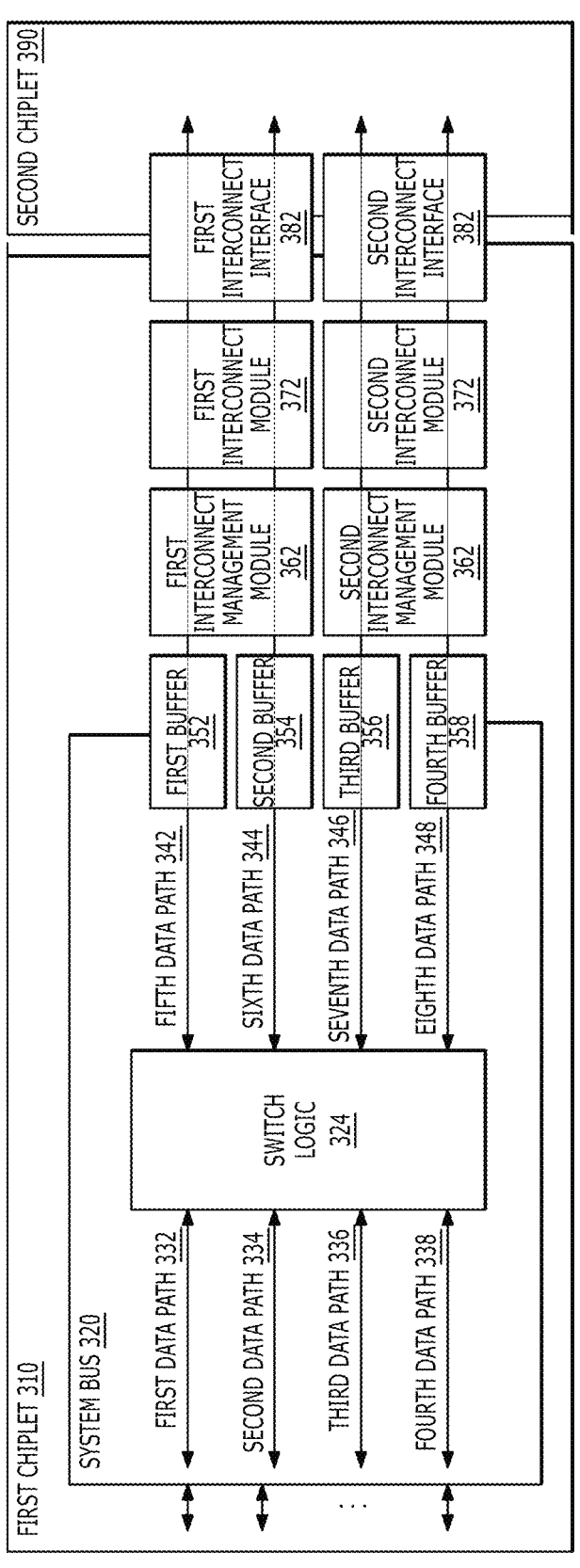
FIG. 3 is a diagram illustrating an example of a chiplet including a switch logic.

FIG. 3 is a diagram illustrating an example of a chiplet 310 including a switch logic 324. Interconnect management modules 362 and 364, interconnect modules 372 and 374, and interconnect interfaces 382 and 384 may correspond to the interconnect management modules 142 and 144, the interconnect modules 152 and 154, and the interconnect interfaces 162 and 164 of FIG. 1, and description of the overlapping elements or operations already described above in FIG. 1 will be omitted.

A system bus 320 of the first chiplet 310 may include a data bus used for data transmission and reception and the switch logic 324 that determines a data transmission and reception path. The data bus may include first to fourth data paths 332, 334, 336, and 338 illustrated in FIG. 3, and may include at least some of fifth to eighth data paths 342, 344, 346, and 348.

The first data path 322, the second data path 334, the third data path 336, and the fourth data path 338 may be paths through which information is transmitted and received between the switch logic 324 and the components in the first chiplet 310. The fifth data path 342, the sixth data path 344, the seventh data path 346, and the eighth data path 348 may be paths through which information is transmitted and received between the switch logic 324 and a second chiplet 390.

For example, the fifth data path 342 and the sixth data path 344 may refer to paths through which information (or transaction) is transmitted and received to and from the second chiplet 390 using the first interconnect interface 382, through buffers 352 and 354, the first interconnect management module 362, and the first interconnect module 372. In addition, the seventh data path 346 and the eighth data path 348 may refer to paths through which information (or transaction) is transmitted and received to and from the second chiplet 390 using the second interconnect interface 384, through buffers 356 and 358, the second interconnect management module 364, and the second interconnect module 374.

Aspects are not limited to the above, and there may be any number (e.g., one, three or more) of data paths through which data is transmitted and received using each of the interconnect interfaces 382 and 384, or other data paths using interfaces different from the first interconnect interface 382 and the second interconnect interface 384 may be further included.

In an example, the interconnect management modules 362 and 364 may be excluded from the first chiplet 310 and the data paths 342, 344, 346, and 348.

The switch logic 324 may connect each of the first data path 332, the second data path 334, the third data path 336, and the fourth data path 338 connected to the switch logic 324 to any one of the fifth data path 342, the sixth data path 344, the seventh data path 346, and the eighth data path 348 to determine a data transmission and reception path between the first chiplet 310 and the second chiplet 390.

The switch logic 324 may be activated in response to determining that a communication failure occurs between the first chiplet 310 and the second chiplet 390. The switch logic 324 may be activated in response to an occurrence of a communication failure such as a disconnection or a communication performance degradation equal to or greater than a predetermined threshold in at least a part of the fifth data path 342 and the sixth data path 344 connected to the first interconnect interface 382, or in at least a part of the seventh data path 346 and the eighth data path 348 connected to the second interconnect interface 384, resulting in change in at least a part of the data (or transaction) transfer path between the first chiplet 310 and the second chiplet 390.

For example, the first data path 332 that was connected to the fifth data path 342 before the switch logic 324 is activated (or while the switch logic 324 is bypassed) may be connected to the seventh data path 346 as the switch logic 324 is activated, and accordingly, the interconnect interface 384 used during data transmission or reception may be changed. An example in which part of the data transfer path is changed will be described below in detail below with reference to FIGS. 6 to 8.

Alternatively, the switch logic 324 may be bypassed in response to determining that no communication failure occurs on the data path. This will be described below with reference to FIG. 5.

The switch logic 324 may be implemented in hardware through a circuit structure, etc., or may be implemented in software using a predetermined protocol, algorithm, etc. Alternatively, the switch logic 324 may be implemented by a combination of hardware and software. Although it is illustrated that the switch logic 324 is included in the system bus 320, aspects are not limited thereto, and it may be provided outside the system bus 320 in the first chiplet 310.

The buffers 352, 354, 356, and 358 may be individually allocated to each of the data paths 342, 344, 346, and 348. As a result, data flow using each of the data paths 342, 344, 346, and 348 may be effectively managed.

The buffers 352, 354, 356, and 358 may be asynchronous First-In, First-Out (FIFO). That is, clock domains inside the system bus 320 and outside the system bus 320 may be different from each other. As a result, the buffers 352, 354, 356, and 358 may ensure reliable data transfer between different parts of the system operating in different clock domains and manage data integrity.

FIG. 3 illustrates that the transfer path of data transmitted and received is determined using the switch logic 324, but aspects are not limited thereto, and the transfer path of information such as control signals, etc. may be additionally determined using the switch logic 324.

Figure 4:
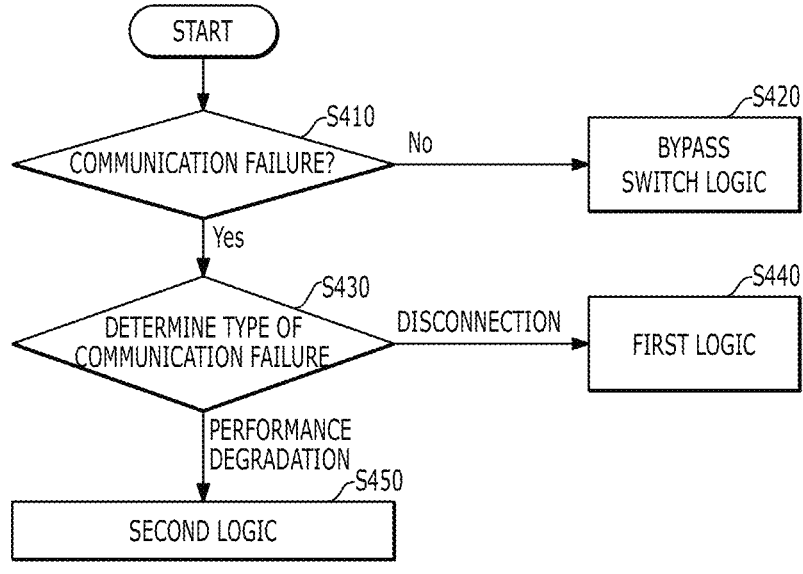
FIG. 4 is a flowchart provided to explain an example of applying a switch logic based on a communication failure.

FIG. 4 is a flowchart provided to explain an example of applying the switch logic based on the communication failure. In order to determine whether to apply the switch logic, whether there is a communication failure between chiplets transmitting and receiving data to each other may be determined, at S410. Whether there is a communication failure or not may be determined by the interconnect management module in the chiplet.

The switch logic may be bypassed in response to determining that no communication failure occurs between the chiplets, at S420. That is, if it is determined that no communication failure occurs between chiplets, the switch logic may be not applied and data transmission and reception between chiplets may be performed through an existing data path. An example in which the switch logic is bypassed is described with reference to FIG. 5.

Alternatively, in response to determining that a communication failure occurs between the chiplets, the type of the communication failure may be determined, at S430. The type of switch logic to be applied may be determined based on the determined type of communication failure.

For example, a first logic may be applied in response to determining that a disconnection occurs in at least a part of a chiplet interconnect path, at S440. Alternatively, a second logic may be applied in response to determining that a communication performance degradation equal to or greater than a predetermined threshold occurs in at least a part of the chiplet interconnect path, at S450. An example in which the first logic is applied is described in FIG. 6, and an example in which the second logic is applied is described in FIG. 7.

The occurrence of the communication failure between chiplets and/or the type of communication failure may be determined using various aspects.

The occurrence of the communication failure and/or the type of communication failure may be determined based on a transfer time of a request transaction and an associated response transaction transmitted and received using the chiplet interconnect interfaces (e.g., the interconnect interfaces 162 and 164 of FIG. 1). For example, a difference between the time when the request transaction is transferred from one chiplet and the time when the associated response transaction is transmitted to that chiplet may be measured, and it may be determined that the communication performance degradation occurs if the measured time difference is greater than a predetermined expected time. In this case, the transmitted and received transactions may be transactions actually used (e.g., processed) in a specific chiplet, or transactions generated to determine occurrence of a communication failure and the type of communication failure.

In another aspect, it may be determined that the communication failure occurs, in response to determining that measured values of a voltage sensor and/or a temperature sensor provided in the chiplet and/or the electronic device are out of a predetermined normal range.

Although it is illustrated in the flowchart of FIG. 4 and described that the occurrence of the communication failure and the type of communication failure are determined in two stages, aspects are not limited thereto, and S410 and S430 may be executed at the same time.

Figure 5:
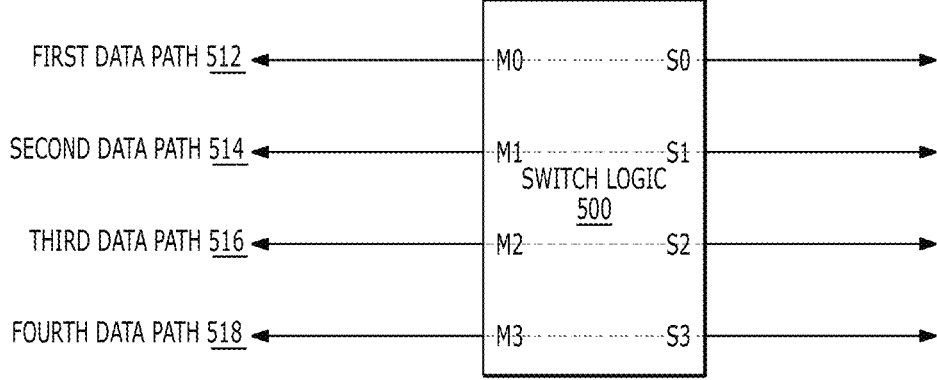
FIG. 5 is a diagram illustrating an example in which a switch logic is bypassed.

FIG. 5 is a diagram illustrating an example in which a switch logic 500 is bypassed. The switch logic 500 of FIG. 5 may correspond to the switch logic 324 of FIG. 3, and FIG. 5 may correspond to a result of bypassing the switch logic at S420 of the flowchart of FIG. 4.

Data paths 512, 514, 516, and 518 may be the existing data transmission and reception paths connecting the first chiplet and the second chiplet. In addition, the switch logic 500 may be bypassed in response to determining that no communication failure (e.g., disconnection or performance degradation) occurs in the data paths 512, 514, 516, and 518, such that data (e.g., data transaction) between the first and second chiplets may be transmitted and received without the data transfer path being changed by the switch logic 500. As a result, the switch logic 500 used in response to the occurrence of the communication failure is not used when the communication failure does not occur, thus preventing overhead (e.g., latency overhead) that may occur when the switch logic 500 is always used regardless of whether communication failure occurs.

Figure 6:
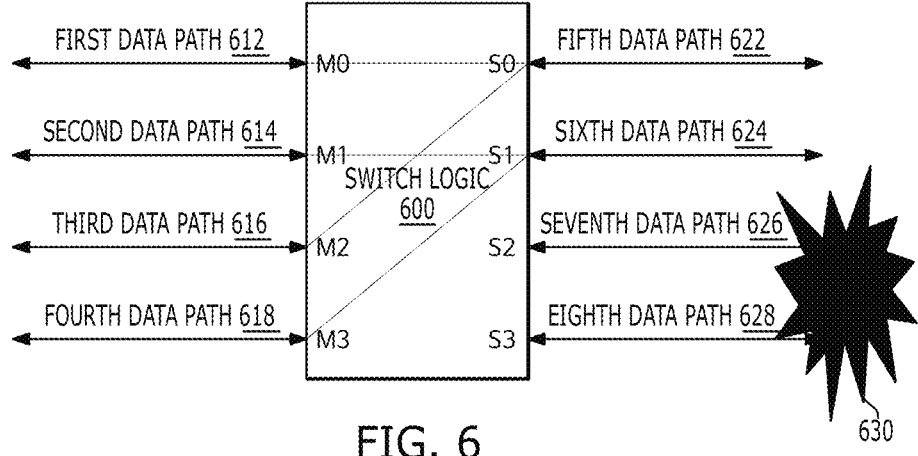
FIG. 6 is a diagram illustrating an example in which a switch logic is activated in response to an occurrence of a disconnection.

FIG. 6 is a diagram illustrating an example in which a switch logic 600 is activated in response to the occurrence of a disconnection 630. The switch logic 600 of FIG. 6 may correspond to the switch logic 324 of FIG. 3, and FIG. 6 may correspond to the first logic of the switch logic being activated at S440 of the flowchart of FIG. 4.

First to fourth data paths 612, 614, 616, and 618 may correspond to the first to fourth data paths 332, 334, 336, and 338 of FIG. 3, respectively, and fifth to eighth data paths 622, 624, 626, and 628 may correspond to the fifth to eighth data paths 342, 344, 346, and 348 of FIG. 3, respectively.

However, the fifth to eighth data paths 622, 624, 626, and 628 are not necessarily included in the first to fourth data paths 512, 514, 516, and 518 of FIG. 5. That is, the data path connected to the second chiplet when the switch logic 600 is bypassed, and the data path connected to the second chiplet when the switch logic 600 is activated may be the data paths connected to the second chiplet through the same interconnect interface, but they may be different from each other.

The disconnection 630 for activating the first logic of the switch logic 600 may occur for at least a part of the data path. For example, the disconnection 630 may occur in any element in the data path such as the interconnect management module, the interconnect module, the interconnect interface, etc. FIG. 6 may illustrate an example in which the disconnection 630 occurs in the second interconnect interface 384 (or, in the seventh data path 626 and the eighth data path 628) of FIG. 3.

In response to the occurrence of disconnection 630, the switch logic 600 (or the first logic) may connect one or more of the first to fourth data paths 612, 614, 616, and 618 connected through the second interconnect interface on the existing path to the fifth data path 622 and/or the sixth data path 624 which are not disconnected. For example, the switch logic 600 may connect the first data path 612 and the third data path 616 to the fifth data path 622 (that is, it 600 may connect points M0 and M2 to S0), and connect the second data path 614 and the fourth data path 618 to the sixth data path 624 (that is, it 600 may connect points M1 and M3 to S1).

That is, the switch logic 600 may connect a path in the system bus of the first chiplet connected to the switch logic 600 to a data path to the second chiplet where no disconnection 630 has occurred. As a result, data transmission and reception between chiplets may not be interrupted despite the communication failure due to disconnection.

Figure 7:
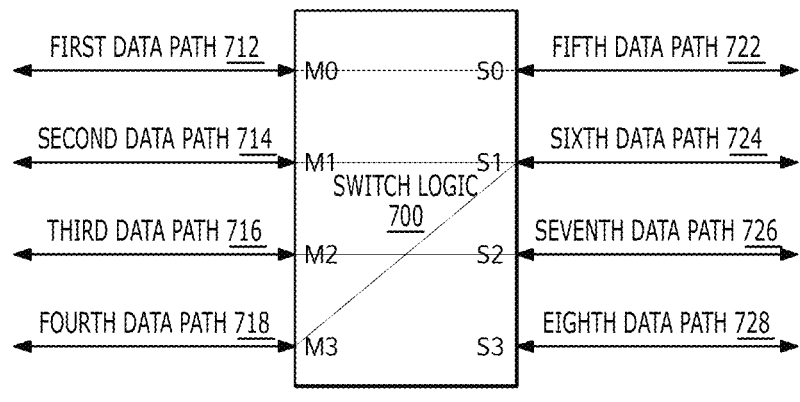
FIG. 7 is a diagram illustrating an example in which a switch logic is activated in response to an occurrence of a communication performance degradation.

FIG. 7 is a diagram illustrating an example in which a switch logic 700 is activated in response to an occurrence of a communication performance degradation. The switch logic 700 of FIG. 7 may correspond to the switch logic 324 of FIG. 3, and FIG. 7 may correspond to the second logic of the switch logic being activated at S450 of the flowchart of FIG. 4. In addition, the first to fourth data paths 712, 714, 716, and 718 may correspond to the first to fourth data paths 332, 334, 336, and 338 of FIG. 3, respectively, and the fifth to eighth data paths 722, 724, 726, and 728 may correspond to the fifth to eighth data paths 342, 344, 346, and 348 of FIG. 3, respectively.

However, the fifth to eighth data paths 722, 724, 726, and 728 are not necessarily included in the first to fourth data paths 512, 514, 516, and 518 of FIG. 5. That is, the data path connected to the second chiplet when the switch logic 700 is bypassed, and the data path connected to the second chiplet when the switch logic 700 is activated may be connected to the second chiplet through the same interconnect interface, but they may be different from each other.

Unlike disconnection, communication performance degradation may refer to a decrease in communication performance indicators such as communication speed while communication between chiplets is still possible. For example, the switch logic 700 (or the second logic) may be activated in response to determining that a communication performance degradation equal to or greater than a predetermined threshold occurs.

The communication performance degradation for activating the second logic of the switch logic 700 may occur for at least a part of the fifth to eighth data paths 722, 724, 726, and 728. For example, the communication performance degradation may occur in any element in the data path such as the interconnect interface, the interconnect management module or interconnect module.

In response to the occurrence of communication performance degradation in the data path, the switch logic 700 (or the second logic) may connect the first to fourth data paths 712, 714, 716, and 718 to the fifth to eighth data paths 722, 724, 726, and 728, but the connection to certain data paths where the communication performance degradation occurs may be omitted. For example, in response to the occurrence of communication performance degradation at the second interconnect interface on the seventh data path 726 and the eighth data path 728, the switch logic 700 may connect the first data path 712 to the fifth data path 722 (that is, it 700 may connect a point M0 to a point S0), connect the second data path 714 and the third data path 716 to each of the sixth data path 724 and the seventh data path 726 (that is, it 700 may connect each of points M1 and M2 to S1 and S2), and connect the fourth data path 718 to the sixth data path 724 (that is, it 700 may connect point M3 to point S1). That is, the switch logic 700 may connect the data paths with each other such that, among the first and the fourth data paths 712, 714, 716, and 718, the number of data paths connected to a data path to the second chiplet in which no communication performance degradation occurs is greater than the number of data paths connected to a data path to the second chiplet in which communication performance degradation occurs. As a result, transmission and reception of data between chiplets may proceed relatively smoothly even if communication performance degradation occurs.

In FIGS. 6 and 7, when the data paths are connected to each other, the connection relationship may be determined based on various pieces of information. For example, if a communication failure occurs, the connection relationship between the data paths may be determined based on a bandwidth of each data path, a size of the data transmitted and received, a latency, a signal integrity, traffic balancing, etc.

In FIGS. 6 and 7, in response to the switch logic 600 and 700 operating, the bandwidth of the chiplet interconnect interface may be increased by adjusting the voltage and/or transmission speed, etc. of the chiplet interconnect interface. Accordingly, even when the switch logic 600 and 700 operates, the problem in which the throughput of transactions (e.g., control transactions and/or data transactions, etc.) is reduced compared to before the switch logic 600 and 700 operates may be prevented.

FIG. 8 is a diagram illustrating an example implementation of the switch logic. The example implementation of the switch logic is illustrated in a table 800, which is for the convenience of explanation. In the table 800 shown, points M0, M1, M2, and M3 may represent connection points between the data paths and the switch logic in the system bus of the first chiplet connected to the switch logic, respectively, and points S0, S1, S2, and S3 may represent connection points between the data paths and the switch logic through which information is transmitted to the second chiplet. Specifically, in the description of FIG. 8, it is described that S0 and S1 are points connected through the first interconnect interface between chiplets, and that S2 and S3 are points connected through the second interconnect interface between chiplets, which is different from the first interconnect interface.

The table 800 shown in FIG. 8 illustrates an example in which the chiplet interconnect path is determined by the switch logic by connecting each of M0, M1, M2, and M3 to any one of S0, S1, S2, and S3 in each case CASE #2 to CASE #8.

The first example 810 (CASE #1) may represent an example in which the switch logic is not activated and bypassed in response to determining that no communication failure has occurred between the chiplets (see FIG. 5).

The second examples 820 (CASE #2 and CASE #3) may represent examples in which the switch logic (or the first logic of FIG. 4) is activated in response to determining that a disconnection occurs in any one of the chiplet interconnect paths (see FIG. 6).

For example, CASE #2 (corresponding to the switch logic 600 of FIG. 6) may represent an example in which, in response to determining that a disconnection occurs in the second interconnect interface, M0 to M3 are connected to S0 and S1 so as to be connected to the second chiplet through the first interconnect interface in which no disconnection has occurred.

On the contrary, CASE #3 may represent an example in which, in response to determining that a disconnection occurs in the first interconnect interface, M0 to M3 are connected to S2 and S3 so as to be connected to the second chiplet through the second interconnect interface in which no disconnection has occurred.

The third examples 830 (CASE #4 to CASE #7) may represent examples in which the switch logic (or the second logic of FIG. 4) is activated in response to determining that a communication performance degradation occurs in any one of the chiplet interconnect paths (see FIG. 7). For example, CASE #4 (corresponding to the switch logic 700 in FIG. 7) and CASE #5 may illustrate examples in which, in response to determining that a performance degradation occurs in the second interconnect interface, three points of M0 to M3 are connected to the second chiplet through the first interconnect interface in which no performance degradation has occurred. Conversely, CASE #6 and CASE #7 may represent examples in which, in response to determining that a performance degradation occurs in the first interconnect interface, three points of M0 to M3 are connected to the second chiplet through the second interconnect interface in which no performance degradation has occurred.

The switch logic is not limited to the example included in the table 800, and the information transfer path may be determined/changed according to various logics.

Figure 9:
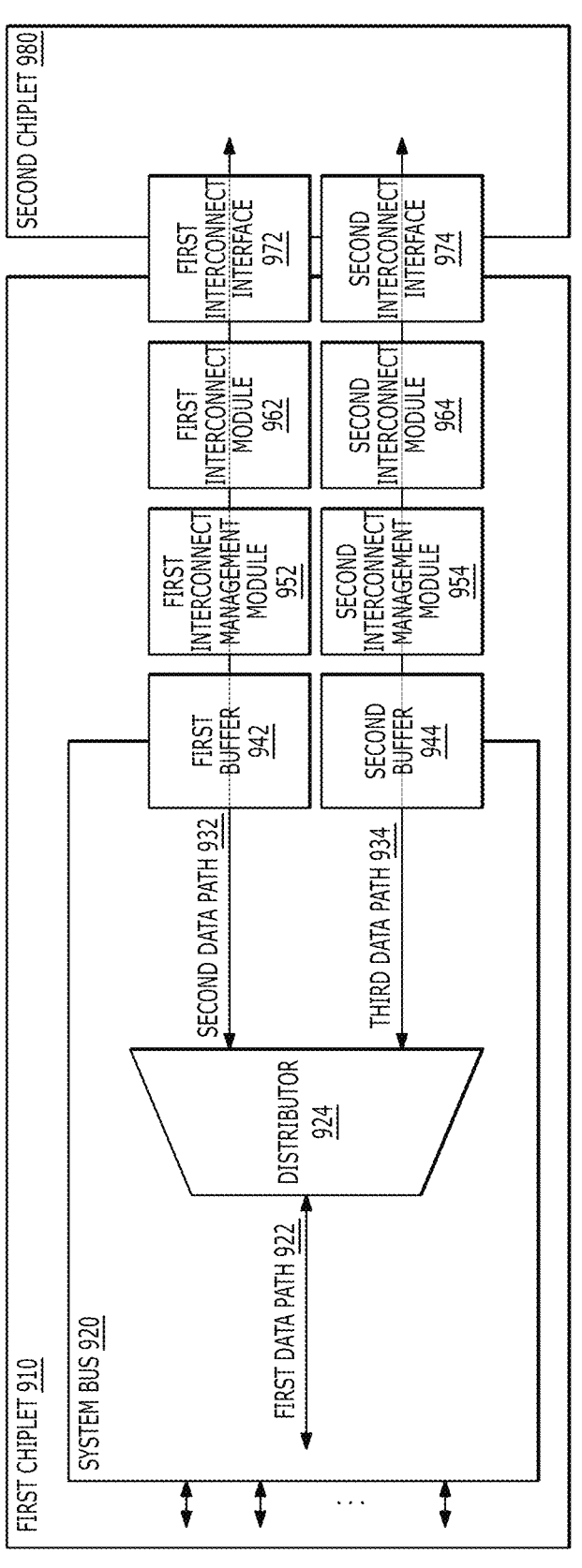
FIG. 9 is a diagram illustrating an example of a chiplet including a distributor.

FIG. 9 is a diagram illustrating an example of a chiplet 910 including a distributor 924. Interconnect management modules 952 and 954, interconnect modules 962 and 964, and interconnect interfaces 972 and 974 may correspond to the interconnect management modules 142 and 144, the interconnect modules 152 and 154, and the interconnect interfaces 162 and 164 of FIG. 1, and description of the overlapping elements or operations already described above in FIG. 1 will be omitted.

A system bus 920 of the first chiplet 910 may include a data bus that is used for data transmission and reception, and the distributor 924 that determines a data transmission and reception path. The data bus may include a first data path 922, a part of a second data path 932, and a part of a third data path 934, as illustrated in FIG. 9.

The first data path 922 may be a path through which information is transmitted and received between the distributor 924 and the first chiplet 910 (or the system bus 920). The second data path 932 and the third data path 934 may be paths through which information is transmitted and received between the distributor 924 and a second chiplet 980.

For example, the second data path 932 may refer to a path for transmitting and receiving information (or control transaction) to and from the second chiplet 980 using the first interconnect interface 972 through a first buffer 942, a first interconnect management module 952, and a first interconnect module 962, and the third data path 934 may refer to a path for transmitting and receiving information (or transaction) to and from the second chiplet 980 using the second interconnect interface 974 through a second buffer 944, a second interconnect management module 954, and a second interconnect module 964. Aspects are not limited to the above, and there may be any number (e.g., one, three or more) of data paths through which data is transmitted and received using each of the interconnect interfaces 972 and 974, or other data paths using interfaces different from the first interconnect interface 972 and the second interconnect interface 974 may be further included.

In an example, the interconnect management modules 952 and 954 may be omitted from the first chiplet 910 and the data paths 932 and 934.

The distributor 924 may connect the first data path 922 connected to the distributor 924 to any one of the second data path 932 and the third data path 934 to determine a data transmission and reception path between the first chiplet 910 and the second chiplet 980. The distributor 924 may be implemented as a demultiplexer. The information transmitted and received to and from the second chiplet 980 through the distributor 924 may be a control transaction and/or a control signal.

In response to determining that no communication failure has occurred between the first chiplet 910 and the second chiplet 980, the distributor 924 may connect the first data path 922 to the second data path 932 or the third data path 934.

In response to at least a part of the second data path 932 and the third data path 934 being disconnected, or in response to an occurrence of a communication failure such as communication performance degradation equal to or greater than a predetermined threshold, the distributor 924 may determine a data (or control transaction) transfer path from the first chiplet 910 to the second chiplet 980. For example, the distributor 924 may connect the first data path 922 and the third data path 934 in response to determining that a communication failure occurs in a part of the second data path 932, and may connect the first data path 922 and the second data path 932 in response to determining that a communication failure occurs in a part of the third data path 934.

Although it is illustrated that the distributor 924 is included in the system bus 920, aspects are not limited thereto, and the distributor 924 may be provided outside the system bus 920 in the first chiplet 910.

The buffers 942 and 944 may be individually allocated to the second data path 932 and the third data path 934. As a result, data flow using each of the data paths 932 and 934 may be effectively managed.

The buffers 942 and 944 may be asynchronous First-In, First-Out (FIFO). That is, clock domains inside the bus 920 and outside the bus 920 may be different from each other. As a result, the buffers 942 and 944 may ensure reliable data transfer between different parts of the system operating in different clock domains and manage data integrity.

FIG. 9 illustrates that the distributor 924 for distributing or managing the control transaction and/or the control signal transmitted from the first chiplet 910 to the second chiplet 980 is included in the first chiplet 910, but aspects are not limited thereto, and the system logic described in FIGS. 3 to 8 may also be included in the first chiplet 910. In this case, the data path provided by the system logic and the data path provided by the distributor may be different from each other.

Figure 10:
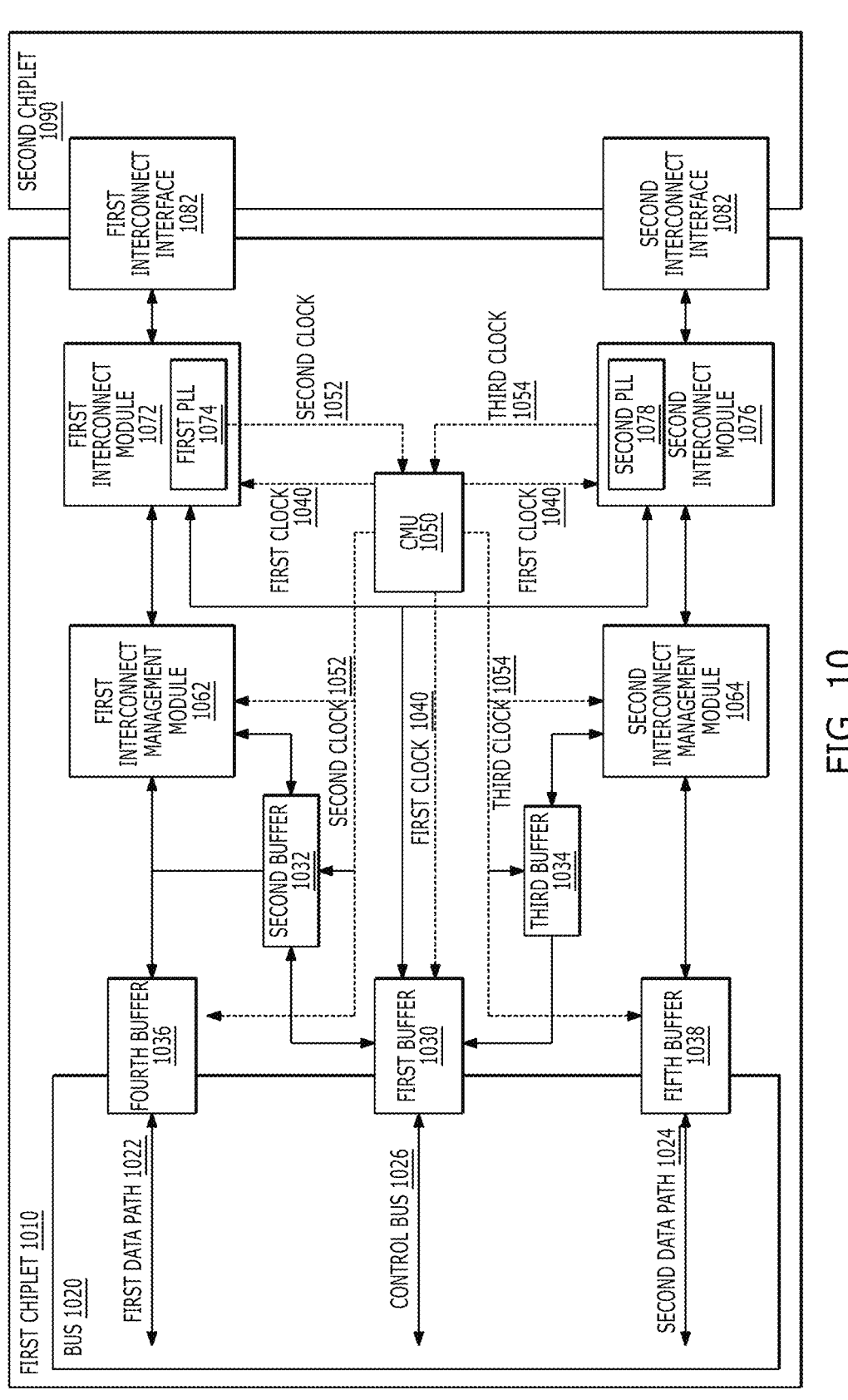
FIG. 10 is a diagram illustrating an example of a path through which a plurality of clocks and information are transmitted.

FIG. 10 is a diagram illustrating an example of a path through which a plurality of clocks 1040, 1052, and 1054 and information are transmitted. Interconnect management modules 1062 and 1064, interconnect modules 1072 and 1074, and interconnect interfaces 1082 and 1084 are provided to connect a first chiplet 1010 and a second chiplet 1090 to each other and may correspond to the interconnect management modules 142 and 144, the interconnect modules 152 and 154 and the interconnect interfaces 162 and 164 of FIG. 1, and description of the overlapping elements or operations already described above in FIG. 1 will be omitted. In addition, a first data path 1022 and a second data path 1024 and buffers 1036 and 1038 connected thereto may correspond to the fifth to eighth data paths 342, 344, 346, and 348 and the buffers 352, 354, 356, and 358 of FIG. 3, or may correspond to the second and third data paths 932 and 934 and the buffers 942 and 944 of FIG. 9.

A path indicated by a solid line in FIG. 10 may indicate a path through which data and/or control signals are transmitted, and a path indicated by a dotted line may indicate a path through which a clock signal is transmitted. Throughout the description, the "clock signal" and the "clock" may have the same meaning and may be used interchangeably. A bus 1020 may include a control bus 1026 that transmits a control signal for controlling the interconnect management modules 1062 and 1064 and the interconnect modules 1072 and 1076. The control signal may be transmitted to a first buffer 1030, then transmitted to a second buffer 1032 and/or a third buffer 1034, and then transmitted to the first interconnect management module 1062 and/or the second interconnect management module 1064. Additionally, the control signal may be transmitted to the first buffer 1030 and then to the first interconnect module 1072 and/or the second interconnect module 1076.

The first buffer 1030 may be an asynchronous First-In, First-Out (FIFO). The first buffer 1030 may receive the first clock 1040 from a Clock Management Unit (CMU) 1050, and may serve as a buffer between the clock domain to which the first clock 1040 is applied and the clock domain of the bus 1020. The first clock 1040 may be generated based on a reference clock input to the CMU 1050, and the clock on which the bus 1020 operates may be different from the first clock 1040, the second clock 1052, and the third clock 1054.

The second buffer 1032 and the third buffer 1034 may be asynchronous FIFO. Each of the second buffer 1032 and the third buffer 1034 may serve as a buffer between the clock domain to which the first clock 1040 is applied and the clock domain to which the second clock 1052 or the third clock 1054 is applied. For example, at least a part of the fourth buffer 1036, the first interconnect management module 1062 and the first interconnect module 1072 may be included in the clock domain to which the second clock 1052 is applied, and at least a part of the fifth buffer 1038, the second interconnect management module 1064 and the second interconnect module 1076 may be included in the clock domain to which the third clock 1054 is applied. To this end, the CMU 1050 may transmit the second clock 1052 generated in a first Phase Locked Loop (PLL) 1074 in the first interconnect module 1072 to the second buffer 1032, the fourth buffer 1036, and the first interconnect management module 1062, and may transmit the third clock 1054 generated in a second PLL 1078 in the second interconnect module 1076 to the third buffer 1034, the fifth buffer 1038, and the second interconnect management module 1064.

The control signal transmitted using the control bus 1026 may be transmitted to the domain of the second clock 1052 and/or the domain of the third clock 1054. Alternatively, in response to a communication failure (e.g., disconnection or performance degradation) occurring in either the first interconnect interface 1082 or the second interconnect interface 1084, a control signal may only be transmitted to the domain in which no communication failure has occurred.

Information (data, signal, etc.) transmitted to the second chiplet 1090 using the first interconnect interface 1082 may be transmitted based on the second clock 1052, and information transmitted to the second chiplet 1090 using the second interconnect interface 1084 may be transmitted based on the third clock 1054. The second clock 1052 and the third clock 1054 may be different clocks.

The method described above may be provided as a computer program stored in a computer-readable recording medium for execution on a computer. The medium may be a type of medium that continuously stores a program executable by a computer, or temporarily stores the program for execution or download. In addition, the medium may be a variety of recording means or storage means having a single piece of hardware or a combination of several pieces of hardware, and is not limited to a medium that is directly connected to any computer system, and accordingly, may be present on a network in a distributed manner. An example of the medium includes a medium configured to store program instructions, including a magnetic medium such as a hard disk, a floppy disk, and a magnetic tape, an optical medium such as a CD-ROM and a DVD, a magnetic-optical medium such as a floptical disk, a ROM, a RAM, a flash memory, etc. In addition, other examples of the medium may include an app store that distributes applications, a site that supplies or distributes various software, and a recording medium or a storage medium managed by a server.

The methods, operations, or techniques of the present disclosure may be implemented by various means. For example, these techniques may be implemented in hardware, firmware, software, or a combination thereof. Those skilled in the art will further appreciate that various illustrative logical blocks, modules, circuits, and algorithm steps described in connection with the disclosure herein may be implemented in electronic hardware, computer software, or combinations of both. To clearly illustrate this interchangeability of hardware and software, various illustrative components, blocks, modules, circuits, and steps have been described above generally in terms of their functionality. Whether such a function is implemented as hardware or software depends on design requirements imposed on the particular application and the overall system. Those skilled in the art may implement the described functions in varying ways for each particular application, but such implementation should not be interpreted as causing a departure from the scope of the present disclosure.

In a hardware implementation, processing units used to perform the techniques may be implemented in one or more ASICs, DSPs, digital signal processing devices (DSPDs), programmable logic devices (PLDs), field programmable gate arrays (FPGAs), processors, controllers, microcontrollers, microprocessors, electronic devices, other electronic units designed to perform the functions described in the present disclosure, computer, or a combination thereof.

Accordingly, various example logic blocks, modules, and circuits described in connection with the present disclosure may be implemented or performed with general purpose processors, DSPs, ASICs, FPGAs or other programmable logic devices, discrete gate or transistor logic, discrete hardware components, or any combination of those designed to perform the functions described herein. The general purpose processor may be a microprocessor, but in the alternative, the processor may be any related processor, controller, microcontroller, or state machine. The processor may also be implemented as a combination of computing devices, for example, a DSP and microprocessor, a plurality of microprocessors, one or more microprocessors associated with a DSP core, or any other combination of the configurations.

In the implementation using firmware and/or software, the techniques may be implemented with instructions stored on a computer-readable medium, such as random access memory (RAM), read-only memory (ROM), non-volatile random access memory (NVRAM), programmable read-only memory (PROM), erasable programmable read-only memory (EPROM), electrically erasable PROM (EEPROM), flash memory, compact disc (CD), magnetic or marking data storage devices, etc. The commands may be executable by at least one processor, and may cause the processor(s) to perform certain aspects of the functions described in the present disclosure.

If implemented in software, the techniques described above may be stored on a computer-readable medium as one or more commands or codes, or may be sent via a computer-readable medium. The computer-readable media include both the computer storage media and the communication media including any medium that facilitates the transmission of a computer program from one place to another. The storage media may also be any available media that may be accessible to a computer. By way of non-limiting example, such a computer-readable medium may include RAM, ROM, EEPROM, CD-ROM or other optical disk storage, magnetic disk storage or other magnetic storage devices, or any other media that can be used to transmit or store desired program code in the form of instructions or data structures and can be accessible to a computer. In addition, any connection is properly referred to as a computer-readable medium.

For example, if the software is sent from a website, server, or other remote sources using coaxial cable, fiber optic cable, twisted pair, digital subscriber line (DSL), or wireless technologies such as infrared, wireless, and microwave, the coaxial cable, the fiber optic cable, the twisted pair, the digital subscriber line, or the wireless technologies such as infrared, wireless, and microwave are included within the definition of the medium. The disks and the discs used herein include CDs, laser disks, optical disks, digital versatile discs (DVDs), floppy disks, and Blu-ray disks, where disks usually magnetically reproduce data, while discs optically reproduce data using a laser. The combinations described above should also be included within the scope of the computer-readable media.

The software module may reside in RAM memory, flash memory, ROM memory, EPROM memory, EEPROM memory, registers, hard disk, removable disk, CD-ROM, or any other form of storage medium known. An example storage medium may be connected to the processor such that the processor may read or write information from or to the storage medium. Alternatively, the storage medium may be integrated into the processor. The processor and the storage medium may be present in the ASIC. The ASIC may be present in the user terminal. Alternatively, the processor and storage medium may exist as separate components in the user terminal.

Although the examples described above have been described as utilizing aspects of the currently disclosed subject matter in one or more standalone computer systems, aspects are not limited thereto, and may be implemented in conjunction with any computing environment, such as a network or distributed computing environment. Furthermore, the aspects of the subject matter in the present disclosure may be implemented in multiple processing chips or devices, and storage may be similarly influenced across a plurality of devices. Such apparatus may include PCs, network servers, and portable apparatus.

Although the present disclosure has been described in connection with some aspects herein, various modifications and changes can be made without departing from the scope of the present disclosure, which can be understood by those skilled in the art to which the present disclosure pertains. In addition, such modifications and changes should be considered to fall within the scope of the claims appended herein.

The invention claimed is:

1. An electronic device, comprising:
   a first chiplet comprising a system bus, a first interconnect module, and a second interconnect module;
   a second chiplet connected to the first chiplet through at least one of a first interconnect interface connected to the first interconnect module or a second interconnect interface connected to the second interconnect module; and
   the system bus comprises a switch logic comprising a first logic, wherein
   in response to determining that a communication failure occurs between the first chiplet and the second chiplet, the switch logic is activated to change at least a part of a transfer path through which information is transmitted from the first chiplet to the second chiplet, wherein the first logic is activated in response to determining that a disconnection occurs in at least one path of the transfer path coupled to the switch logic, wherein the transfer path comprises a first path through which information is transmitted to the switch logic, a second path through which the information is transmitted from the switch logic to the first interconnect interface, and a third path through which the information is transmitted from the switch logic to the second interconnect interface, and wherein the first logic comprises a logic that:
      connects the first path to the third path in response to determining that a disconnection occurs in at least a part of the second path, and
      connects the first path to the second path in response to determining that a disconnection occurs in at least a part of the third path.

2. The electronic device according to claim 1, wherein the transfer path comprises a path through which the information is transmitted to the first interconnect interface and a path through which the information is transmitted to the second interconnect interface.

3. The electronic device according to claim 2, wherein, in response to a disconnection of at least a part of the path through which the information is transmitted to the first interconnect interface or at least a part of the path through which the information is transmitted to the second interconnect interface, or in response to an occurrence of a communication performance degradation equal to or greater than a predetermined threshold, it is determined that the communication failure occurs between the first chiplet and the second chiplet.

4. The electronic device according to claim 1, wherein the system bus comprises a data bus used for data transmission and reception.

5. The electronic device according to claim 4, wherein the information comprises a transaction, and the switch logic is connected to the data bus to change at least a part of a transfer path through which the transaction is transmitted.

6. The electronic device according to claim 1, wherein the switch logic further comprises a second logic that is activated in response to determining that a communication performance degradation equal to or greater than a predetermined threshold occurs in at least a part of the second path or at least a part of the third path.

7. The electronic device according to claim 6, wherein the first path comprises a plurality of sub-paths, the second logic connects each of the plurality of sub-paths to the second path or the third path in response to determining that the communication performance degradation equal to or greater than the predetermined threshold occurs in at least the part of the second path, and among the plurality of sub-paths, a number of sub-paths connected to the third path is greater than a number of sub-paths connected to the second path.

8. An electronic device, comprising:

a first chiplet comprising a system bus, a first interconnect module, and a second interconnect module;

a second chiplet connected to the first chiplet through at least one of a first interconnect interface connected to the first interconnect module or a second interconnect interface connected to the second interconnect module; and the system bus comprises a distributor, wherein in response to determining a communication failure occurs between the first chiplet and the second chiplet, at least a part of a transfer path through which information is transmitted from the first chiplet to the second chiplet is changed, wherein the transfer path comprises a fourth path through which information is transmitted to the distributor, a fifth path through which the information is transmitted from the distributor to the first interconnect interface, and a sixth path through which the information is transmitted from the distributor to the second interconnect interface, and the distributor connects the fifth path or the sixth path to the fourth path in response to determining that no communication failure has occurred.

9. The electronic device according to claim 8, wherein the distributor connects the fourth path to the sixth path in response to determining that a communication failure occurs in the fifth path, and the distributor connects the fourth path to the fifth path in response to determining that a communication failure occurs in the sixth path.

10. The electronic device according to claim 8, wherein the information transmitted to the second chiplet through the distributor is a control transaction.

11. The electronic device according to claim 8, wherein the system bus comprises a control bus that transmits a control signal, and the control signal is transmitted to at least one of the first interconnect module or the second interconnect module.

12. An electronic device, comprising:

a first chiplet comprising a system bus, a first interconnect module, and a second interconnect module; and a second chiplet connected to the first chiplet through at least one of a first interconnect interface connected to the first interconnect module or a second interconnect interface connected to the second interconnect module; wherein in response to determining that a communication failure occurs between the first chiplet and the second chiplet, at least a part of a transfer path through which information is transmitted from the first chiplet to the second chiplet is changed, wherein the information transmitted to the second chiplet using the first interconnect interface is transmitted based on a first clock, the information transmitted to the second chiplet using the second interconnect interface is transmitted based on a second clock, and the first clock and the second clock are different from each other.

13. The electronic device according to claim 12, wherein the system bus operates based on a third clock different from the first clock and the second clock, and the information transmitted to the second chiplet using the first interconnect interface or the second interconnect interface is transmitted to the first interconnect interface or the second interconnect interface through an asynchronous First-In, First-Out (FIFO).

14. The electronic device according to claim 13, wherein the first clock is generated in the first interconnect module, and the second clock is generated in the second interconnect module.

15. An electronic device, comprising:

a first chiplet comprising a system bus, a first interconnect module, and a second interconnect module; and a second chiplet connected to the first chiplet through at least one of a first interconnect interface connected to the first interconnect module or a second interconnect interface connected to the second interconnect module, wherein in response to determining that a communication failure occurs between the first chiplet and the second chiplet, at least part of a transfer path through which information is transmitted from the first chiplet to the second chiplet is changed, wherein the first interconnect module and the second interconnect module are configured to communicate with each other based on a first protocol, and at least one of the first chiplet or the second chiplet comprises a third interconnect module configured to communicate with a host based on a second protocol.

16. The electronic device according to claim 15, wherein the first interconnect module and the second interconnect module are modules that support at least one of Universal Chiplet Interconnect Express (UCie), High-Bandwidth Interconnect (HBI), Bunch of Wires (BoW), or extra-short reach (XSR), and the third interconnect module is a module that supports Peripheral Component Interconnect Express (PCie).

17. The electronic device according to claim 15, wherein the system bus is an Advanced extensible Interface (AXI) type bus.

* * * * *